United States Patent
Taketoshi et al.

(10) Patent No.: US 7,397,265 B2
(45) Date of Patent: Jul. 8, 2008

(54) MOS TRANSISTOR CHARACTERISTIC DETECTION APPARATUS AND CMOS CIRCUIT CHARACTERISTIC AUTOMATIC ADJUSTMENT APPARATUS

(75) Inventors: Osamu Taketoshi, Osaka (JP); Sadahiro Watanabe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/723,234

(22) Filed: Mar. 19, 2007

(65) Prior Publication Data

US 2007/0216439 A1    Sep. 20, 2007

(30) Foreign Application Priority Data

Mar. 20, 2006    (JP) .............................. 2006-077313

(51) Int. Cl.
*G01R 31/26* (2006.01)

(52) U.S. Cl. ..................................... 324/769

(58) Field of Classification Search ................. 324/769, 324/750; 702/85
See application file for complete search history.

(56) References Cited

U.S. PATENT DOCUMENTS 5,936,476 A    8/1999    Iravani

FOREIGN PATENT DOCUMENTS

JP    2002-76280 A    3/2002

*Primary Examiner*—Ha Nguyen
*Assistant Examiner*—Shaun Campbell
(74) *Attorney, Agent, or Firm*—McDermott Will & Emery LLP

(57) ABSTRACT

A CMOS circuit characteristic automatic adjustment apparatus includes a replica signal generation circuit for generating a replica signal capable of minimizing a drain voltage of an MOS transistor in a target circuit, a replica circuit for receiving the replica signal, voltage buffers for receiving respective drain voltages of MOS transistors in the target circuit and the replica circuit, respectively, MOS transistors for receiving respective output voltages of the voltage buffers, a comparison circuit for comparing respective sizes of currents flowing in the MOS transistors, respectively, and an adjustment circuit for adjusting, based on a comparison result, operation states of the target circuit and the replica circuit.

14 Claims, 4 Drawing Sheets

MOS TRANSISTOR CHARACTERISTIC DETECTION APPARATUS AND CMOS CIRCUIT CHARACTERISTIC AUTOMATIC ADJUSTMENT APPARATUS

CROSS-REFERENCE TO RELATED APPLICATION

The disclosure of Japanese Patent Application No. 2006-77313 filed on Mar. 20, 2006 including specification, drawings and claims are incorporated herein by reference in its entirety.

BACKGROUND OF THE INVENTION

The present invention relates to an apparatus for detecting an operation state of an MOS transistor, and more particularly relates to an apparatus for detecting whether or not an MOS transistor used as a constant current power supply in a CMOS circuit is operated in a saturated region (herein, being operated in a saturated region is referred to as a "saturated region operability") and an apparatus for automatically adjusting an operation state of the CMOS circuit based on a result of the detection.

Conventionally, it has been known that in a CMOS circuit, a threshold voltage of an MOS transistor is changed due to process variations and temperature change and the like, and this change in threshold voltage influences transistor characteristics. With recent reduction in process size, a breakdown voltage of a gate oxide film and a power supply voltage have been reduced more and more, so that larger influence of the change in threshold voltage of an MOS transistor is given to transistor characteristics.

For example, in a constant current power supply that is an important element in an analog circuit, an MOS transistor constituting the constant current power supply has to be operated in a saturated region. However, due to reduction in operation range of a transistor caused by reduction in power supply voltage and change in threshold voltage and the like, it is difficult to ensure an operation in a saturated region. Therefore, means for detecting saturated region operability of an MOS transistor and, depending on cases, means for automatically adjusting an operation state of an MOS transistor to ensure saturated region operability are additionally required.

To cope with the above-described problems, in a known technique, a threshold voltage of an MOS transistor is measured using a measuring circuit such as an AD converter and a measurement result is fed back, so that an operation state of the MOS transistor is automatically adjusted (see, for example, page 7 and FIG. 1 of Japanese Laid-Open Publication No. 2002-76280). However, in this technique, an AD converter has to be provided, thus resulting in increase in circuit size and power consumption.

SUMMARY OF THE INVENTION

In view of the above-described problems, the present invention has been devised to provide an apparatus for detecting saturated region operability of an MOS transistor while suppressing increase in circuit size and power consumption and, furthermore, an apparatus for automatically adjusting an operation state of a CMOS circuit so that the MOS transistor is operated in a saturated region.

To solve the above-described problems, the present invention provides means as an MOS transistor characteristic detection apparatus for detecting whether or not a first MOS transistor in a target circuit is operated in a saturated region. The apparatus includes: a replica signal generation circuit for generating a replica signal capable of minimizing, if being received by the target circuit, a drain voltage of the first MOS transistor; a replica circuit for receiving the replica signal, the replica circuit being a replica of the target circuit and including a second MOS transistor corresponding to the first MOS transistor; a first voltage buffer for receiving a drain voltage of the first MOS transistor; a second voltage buffer for receiving a drain voltage of the second MOS transistor; a first MOS transistor group including at least one MOS transistor which has the same characteristics as those of the first MOS transistor and in which the same voltages as voltages applied to a gate and a source of the first MOS transistor are applied to a gate and a source, respectively, and an output voltage of the first voltage buffer is applied to a drain; a second MOS transistor group including at least one MOS transistor which has the same characteristics as those of the first MOS transistor and in which the same voltages as voltages applied to a gate and a source of the first MOS transistor are applied to a gate and a source, respectively, and an output voltage of the second voltage buffer is applied to a drain; and a comparison circuit for comparing respective sizes of a first current flowing through the first MOS transistor group and a second current flowing through the second MOS transistor group.

Thus, a minimum drain voltage of the first MOS transistor in the target circuit is reproduced in the second MOS transistor in the replica circuit. The drain voltages are reproduced by the first and second voltage buffers, respectively, as respective drain voltages of the MOS transistors in the first and second MOS transistor groups. Then, the first and second currents flowing through the first and second MOS transistor groups, respectively, are compared by the comparison circuit. From a result of the size comparison between the first and second currents, it is possible to tell whether or not the first MOS transistor in the target circuit is operated in a saturated region.

Specifically, the comparison circuit includes a first I-V conversion circuit for converting the first current to a first voltage, a second I-V conversion circuit for converting the second current to a second voltage, and a comparator for comparing respective sizes of the first and second voltages.

More specifically, each of the first and second I-V conversion circuits includes a diode-connected MOS transistor or a resistor.

Moreover, specifically, the first voltage buffer includes an operational amplifier for receiving the drain voltage of the first MOS transistor and a drain voltage of said at least one MOS transistor of the first MOS transistor group, and an MOS transistor connected to the first MOS transistor group and having a gate to which an output voltage of the operational amplifier is applied. In the same manner, the second voltage buffer includes an operational amplifier for receiving the drain voltage of the second MOS transistor and a drain voltage of at least one MOS transistor of the second MOS transistor group, and an MOS transistor connected to the second MOS transistor group and having a gate to which an output voltage of the operational amplifier is applied.

To solve the above-described problems, the present invention provides another means as a CMOS circuit characteristic automatic adjustment apparatus for automatically adjusting an operation state of the CMOS circuit so that a first MOS transistor in a target circuit in the CMOS circuit is operated in a saturated region. The apparatus includes: a replica signal generation circuit for generating a replica signal capable of minimizing, if being received by the target circuit, a drain voltage of the first MOS transistor; a replica circuit for receiving the replica signal, the replica circuit being a replica of the target circuit and including a second MOS transistor corresponding to the first MOS transistor; a first voltage buffer for receiving a drain voltage of the first MOS transistor; a second voltage buffer for receiving a drain voltage of the second MOS transistor; a first MOS transistor group including at least one MOS transistor which has the same characteristics as those of the first MOS transistor and in which the same voltages as voltages applied to a gate and a source of the first MOS transistor are applied to a gate and a source, respectively, and an output voltage of the first voltage buffer is applied to a drain; a second MOS transistor group including at least one MOS transistor which has the same characteristics as those of the first MOS transistor and in which the same voltages as voltages applied to a gate and a source of the first MOS transistor are applied to a gate and a source, respectively, and an output voltage of the second voltage buffer is applied to a drain; a comparison circuit for comparing respective sizes of a first current flowing through the first MOS transistor group and a second current flowing through the second MOS transistor group; and an adjustment circuit for adjusting, based on a comparison result by the comparator circuit, an operation state of each of the target circuit and the replica circuit.

Thus, a minimum drain voltage of the first MOS transistor in the target circuit is reproduced in the second MOS transistor in the replica circuit. The drain voltages are reproduced by the first and second voltage buffers, respectively, as respective drain voltages of the MOS transistors in the first and second MOS transistor groups. Then, respective sizes of the first and second currents flowing through the first and second MOS transistor groups, respectively, are compared to each other by the comparison circuit. From a result of the size comparison between the first and second currents, it is possible to tell whether or not the first MOS transistor in the target circuit is operated in a saturated region. Therefore, by adjusting an operation state of each of the target circuit and the replica circuit based on the comparison result, the first MOS transistor in the target circuit can be automatically adjusted so as to be operated in a saturated region.

It is preferable that the comparison circuit outputs, as the comparison result, a digital signal indicating whether or not a current difference between the first and second currents exists. Then, when the digital signal indicates that the current difference exists, the adjustment circuit adjusts respective operation states of the target circuit and the replica circuit so that the second current becomes closer to the first current.

Thus, the operation region of the first MOS transistor in the target circuit can be shifted stepwise into a saturated region.

It is more preferable that the adjustment circuit sets respective operation states of the target circuit and the replica circuit by a single adjustment so that each of the operation state becomes a limit of a possible adjustment range.

Thus, the operation range of the first MOS transistor in the target circuit can be more quickly shifted into the saturated region.

Moreover, it is more preferable that when the digital signal indicates that the current difference does not exist, the adjustment circuit adjusts respective operation states of the target circuit and the replica circuit so that an operation point of the second MOS transistor becomes closer to a pinch-off point.

Thus, power consumption of the first MOS transistor can be reduced while the first MOS transistor in the target circuit being able to be operated in the saturated region.

Furthermore, it is preferable that an adjustment width when the second current is made closer to the first current is larger than an adjustment width when an operation point of the second transistor is made closer to the pinch-off point.

Thus, for the first MOS transistor in the target circuit, when the operation range is out of the saturated region, the operation region can be shifted into the saturated region in a relatively quick manner, and when the operation range is within the saturated region, power consumption of the first MOS transistor can be gradually reduced while saturated region operability of the first MOS transistor can be maintained.

Moreover, it is preferable that the comparison circuit outputs, as the comparison result, an analog signal having a corresponding size of the current difference between the first and second currents. Then, the adjustment circuit adjusts respective operation states of the target circuit and the replica circuit according to the analog signal so that an operation point of the second MOS transistor becomes closer to a pinch-off point.

Thus, the operation range of the first MOS transistor in the target circuit can be shifted to an optimal operation range which allows minimum power consumption within the saturated region.

Specifically, the adjustment circuit adjusts a power supply voltage to be applied to the target circuit and the replica circuit.

Moreover, specifically, the adjustment circuit adjusts a bias to be applied to the target circuit and the replica circuit.

Moreover, specifically, the adjustment circuit adjusts a substrate voltage to be applied to the first and second MOS transistors and the MOS transistors in the first and second MOS transistor groups.

As has been described, according to the present invention, while increase in circuit size and power consumption is suppressed, saturated region operability of an MOS transistor in a target circuit can be detected. Furthermore, an operation state of a CMOS circuit can be automatically adjusted so that the MOS transistor is operated in the saturated region. Therefore, a yield of an LSI can be improved.

Moreover, on an LSI, influences of process variations and temperature change on circuit characteristics and the like can be reduced. Thus, it is not necessary to ensure an additional operation margin in designing and an operation margin can be reduced. Therefore, the present invention is effective particularly in a low voltage circuit of which an operation range is limited.

DESCRIPTION OF THE PREFERRED EMBODIMENTS

Hereafter, preferred embodiments of the present invention will be described with reference to the accompanying drawings.

First Embodiment

Figure 1:
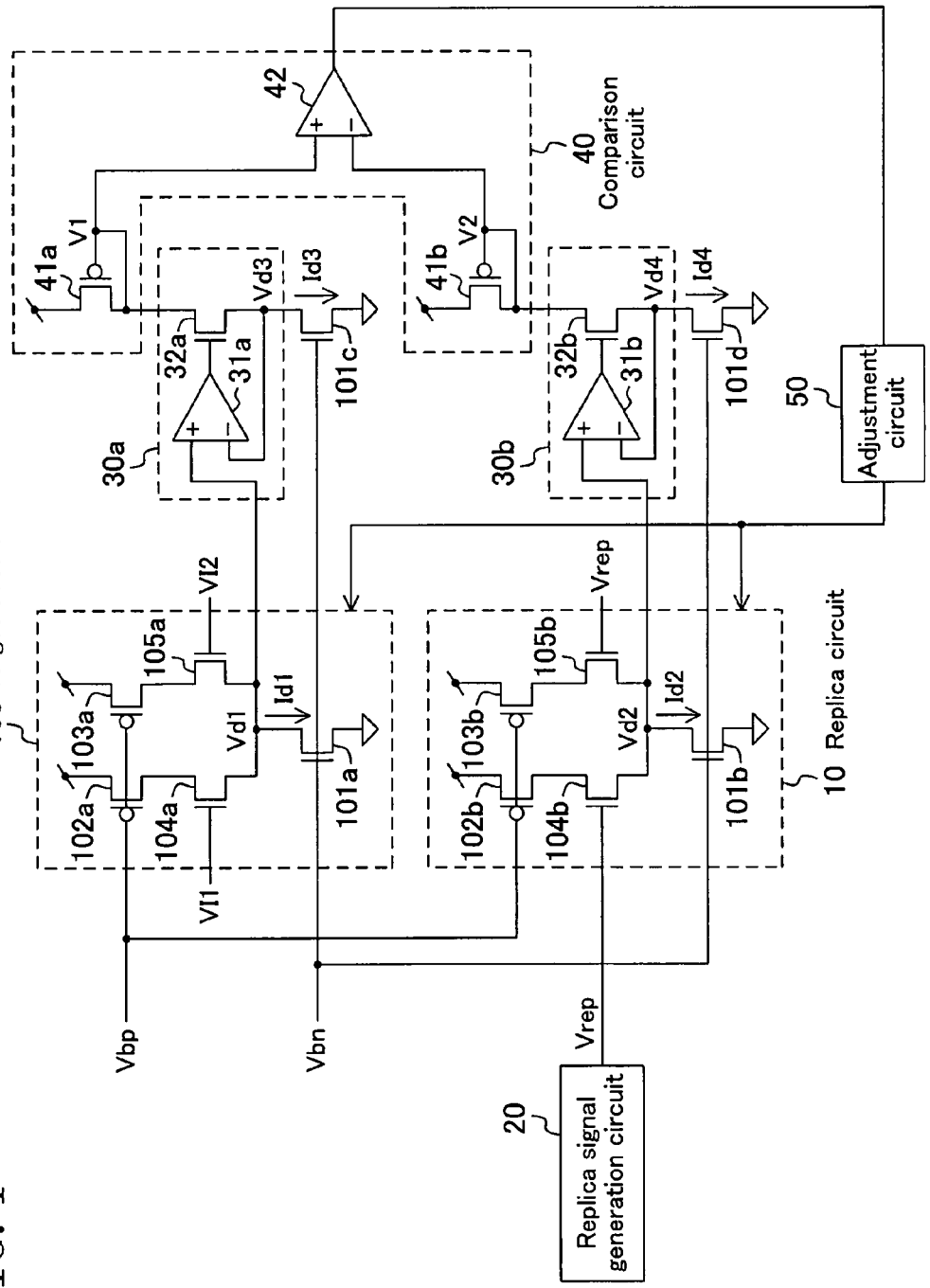
FIG. 1 is a circuit diagram illustrating a configuration of a CMOS circuit characteristic automatic adjustment apparatus according to a first embodiment of the present invention.

FIG. 1 is a circuit diagram illustrating a configuration of a CMOS circuit characteristic automatic adjustment apparatus according to a first embodiment of the present invention. The apparatus of this embodiment includes a replica circuit 10, a replica signal generation circuit 20, voltage buffers 30a and 30b, a comparison circuit 40, an adjustment circuit 50 and n-MOS transistors 101c and 101d. The apparatus adjusts an operation state of a target circuit 100 so that an n-MOS transistor 101a as a constant current power supply in the target circuit 100 is operated in a saturated region. The target circuit 100 is an arbitrary CMOS circuit. Hereafter, for convenience, the target circuit 100 will be described as a differential amplifier.

The target circuit 100 includes the n-MOS transistor 101a, p-MOS transistors 102a and 103a, and n-MOS transistors 104a and 105a. A bias Vbn is applied to a gate of the n-MOS transistor 101a and a reference voltage is applied to a source of the n-MOS transistor 101a. A bias Vbp is applied to respective gates of the p-MOS transistors 102a and 103a and a reference voltage is applied to respective sources of the p-MOS transistors 102a and 103a. Voltages V11 and V12 as differential input signals VI are applied to respective gates of the n-MOS transistors 104a and 105a, respectively.

The replica circuit 10 is a replica of the target circuit 100. In this embodiment, the replica circuit 10 is formed as a differential amplifier. In the replica circuit 10, the n-MOS transistors 101b, 104b and 105b and the p-MOS transistors 102b and 103b correspond to the n-MOS transistors 101a, 104a and 105a and the p-MOS transistors 102a and 103a in the target circuit 100, respectively. The n-MOS transistors and p-MOS transistors in replica circuit 10 have the same characteristics as those of the n-MOS transistors and p-MOS transistors in the target circuit 100, respectively. As in the target circuit 100, the bias Vbn is applied to a gate of the n-MOS transistor 101a and a reference voltage is applied to the source of the n-MOS transistor 101a. The bias Vbp is applied to respective gates of the p-MOS transistors 102b and 103b and a reference voltage is applied to respective sources of the p-MOS transistors 102b and 103b. However, unlike the target circuit 100, a replica signal Vrep is received at respective gates of the n-MOS transistors 104b and 105b.

The replica signal generation circuit 20 generates the replica signal Vrep. The replica signal Vrep is a signal which is capable of minimizing a drain voltage Vd1 of the n-MOS transistor 101a if the signal is received by the target circuit 100. In a differential amplifier, when a differential input is in phase and at an amplitude center level, the drain voltage Vd1 is minimal. Accordingly, in this embodiment, the replica signal generation circuit 20 outputs, as the replica signal Vrep, a voltage at an amplitude center level of the differential input signal VI. Specifically, a potential difference between the voltages V11 and V12 is divided by two resistors to obtain a voltage at the amplitude center level of the differential input signal VI.

The voltage buffer 30a includes an operational amplifier 31a and an n-MOS transistor 32a. The operational amplifier 31a receives the drain voltage Vd1 of the n-MOS transistor 101a in the target circuit 100 and a drain voltage Vd3 of the n-MOS transistor 101c. The n-MOS transistor 32a is connected to the n-MOS transistor 101c and an output voltage of the operational amplifier 31a is applied to a gate of the n-MOS transistor 32a. That is, the voltage buffer 30a is operated so that the drain voltages Vd1 and Vd3 become equal to each other. An impedance of each of an inversion input terminal and a non-inversion terminal is very high. Therefore, influences of the operational amplifier 31a on operations of the target circuit 100 and the n-MOS transistor 101c can be ignored.

The voltage buffer 30b includes an operational amplifier 31b and an n-MOS transistor 32b. The operational amplifier 31b receives the drain voltage Vd2 of the n-MOS transistor 101b in the replica circuit 10 and a drain voltage Vd4 of the n-MOS transistor 101d. The n-MOS transistor 32b is connected to the n-MOS transistor 101d and an output voltage of the operational amplifier 31b is applied to a gate of the n-MOS transistor 32b. That is, the voltage buffer 30b is operated so that the drain voltages Vd2 and Vd4 become equal to each other. An impedance of each of an inversion input terminal and a non-inversion input terminal is very high. Therefore, influences of the operational amplifier 31b on operations of the replica circuit 10 and the n-MOS transistor 101d can be ignored.

The comparison circuit 40 compares respective sizes of drain currents Id3 and Id4 flowing in the n-MOS transistors 101c and 101d, respectively. In this case, each of the n-MOS transistors 101c and 101d has the same characteristics as those of the n-MOS transistor 101a in the target circuit 100. The bias Vbn is applied to respective gates of the n-MOS transistors 101c and 101d and a reference voltage is applied to respective sources of the n-MOS transistors 101c and 101d. Accordingly, in the n-MOS transistor 101c, a drain current Id1 flowing through the n-MOS transistor 101a is mirrored and the drain current Id3 flows. In the same manner, in the n-MOS transistor 101d, a drain current Id2 flowing through the n-MOS transistor 101b is mirrored and a drain current Id4 flows. That is, the comparison circuit 40 substantially compares respective sizes of the drain currents Id1 and Id2.

Specifically, the comparison circuit 40 includes p-MOS transistors 41a and 41b each of which is diode-connected, and a comparator 42. The p-MOS transistor 41a is operated as an active load or an I-V conversion circuit for converting the drain current Id3 flowing through the n-MOS transistor 101c to a voltage V1. In the same manner, the p-MOS transistor 41b is operated as an active load or an I-V conversion circuit for converting the drain current Id4 flowing through the n-MOS transistor 101d to a voltage V2. The comparator 42 compares respective sizes of the voltages V1 and V2 converted by the p-MOS transistors 41a and 41b, respectively. That is, the comparison circuit 40 indirectly compares, after conversion of the drain currents Id3 and Id4 to voltages, respective sizes of the drain currents Id3 and Id4. As a matter of course, size comparison between the drain currents Id3 and Id4 may be directly performed.

An output of the comparator 40 may be either a digital signal or an analog signal. When the output is a digital signal, it can be simply expressed whether or not a current difference between the drain currents Id3 and Id4 exists. On the other hand, when the output is an analog signal, a current difference size can be expressed.

The adjustment circuit 50 adjusts an operation state of each of the target circuit 100 and the replica circuit 10 based on a result of comparison by the comparator 40. Specifically, when the comparison result of the comparator 40 shows that a current difference between the drain currents Id3 and Id4 exists, the adjustment circuit 50 adjust an operation state of each of the target circuit 100 and the replica circuit 10 so that the drain current Id2 becomes closer to the drain current Id1. On the other hand, when the comparison result of the comparison circuit 40 show that a current difference between the drain currents Id3 and Id4 does not exist, the adjustment circuit 50 adjusts characteristics of each of the target circuit 100 and the replica circuit 10 so that an operation point of the n-MOS transistor 101b becomes closer to a pinch-off point.

Figure 2:
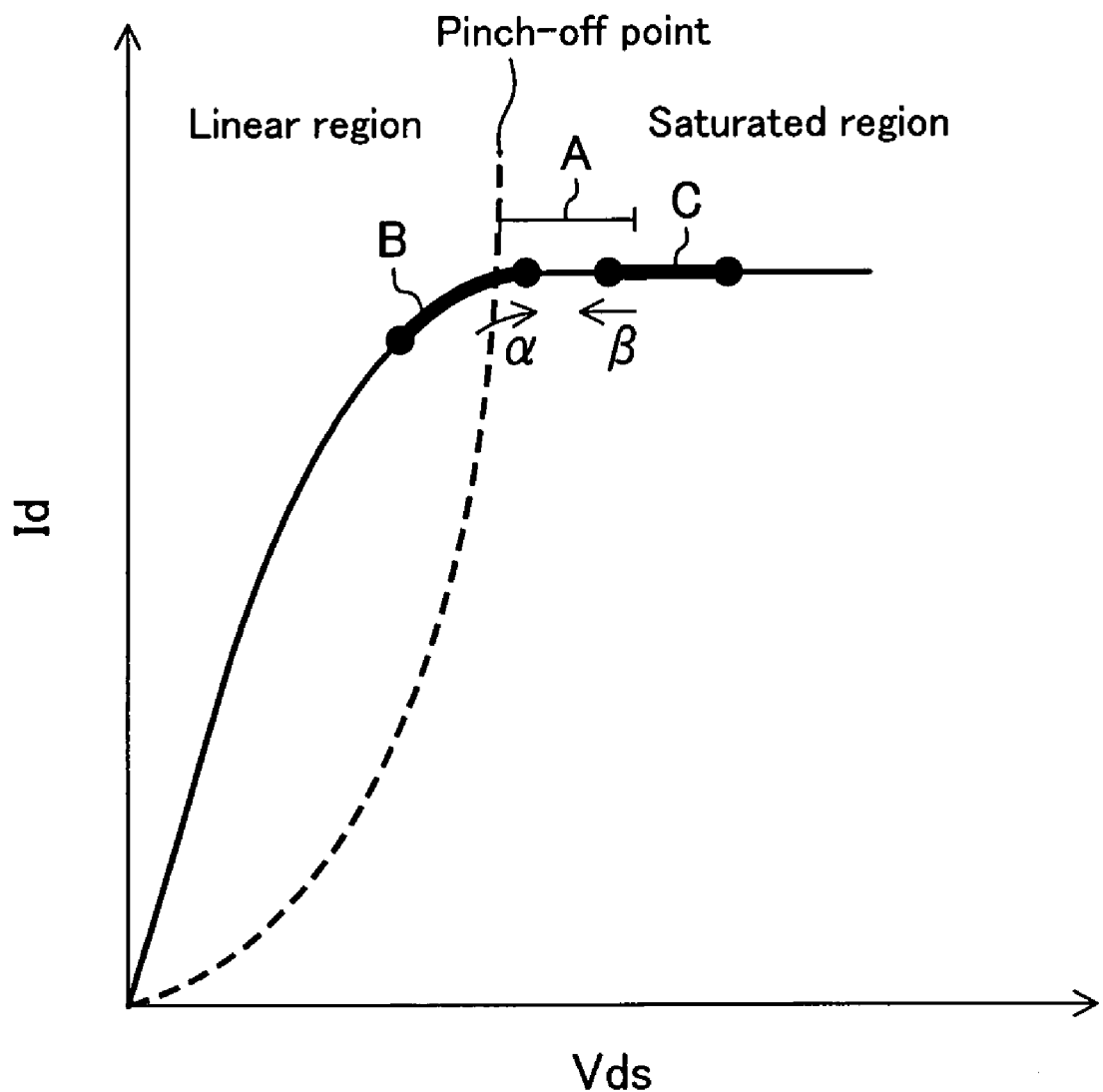
FIG. 2 is a graph describing the principle of characteristic adjustment.

The principle of the adjustment by the adjustment circuit 50 will be described with reference to FIG. 2. The n-MOS transistor 101a used as a constant current power supply has to be operated in a saturated region. Furthermore, in view of achieving low power operation, a low drain voltage is preferable. Accordingly, a range A is an optimal operation range of the n-MOS transistor 101a. However, in an actual situation, there are cases where the n-MOS transistor 101a is operated in a range B including a linear region due to process variations, temperature change and the like. In this case, a current difference between a drain current at a lower limit of the range B, i.e., an operation point of the n-MOS transistor 101b and a drain current at an operation point of the n-MOS transistor 101a is generated. A similar current difference is also generated between the n-MOS transistor 101c and the n-MOS transistor 101d. When a current difference is detected based on a comparison result of the comparator 40, the adjustment circuit 50 adjusts an operation state of each of the target circuit 100 and the replica circuit 10 so that a drain current of the n-MOS transistor 101b becomes closer to a drain current of the n-MOS transistor 101a. As a result, the operation range of the n-MOS transistor 101a is shifted in a direction α so that the entire operation range is included in the saturated region.

When an amount of adjustment by the adjustment circuit 50 is too large, there might be cases where the operation range of the n-MOS transistor 101a goes beyond the range A which is an optimal operation range and reaches a range C. In this case, the n-MOS transistor 101b is operated in a saturated region, so that a current difference between a drain current at an operation point of the n-MOS transistor 101b, i.e., a lower limit of the range C and a drain current at an operation point of the n-MOS transistor 101a is not generated. Accordingly, a current difference between the n-MOS transistor 101c and the n-MOS transistor 101d is not generated. When it is detected based on a comparison result of the comparator 40 that a current difference is not generated, the adjustment circuit 50 adjusts an operation state of each of the target circuit 100 and the replica circuit 10 so that the operation point of the n-MOS transistor 101b becomes closer to a pinch-off point. As a result, the operation range of the n-MOS transistor 101a is shifted back in a direction β toward the range A which is an optimal operation range.

The adjustment circuit 50 may be, for example, a variable power supply which is capable of adjusting a power supply voltage and the bias Vbp to be applied to the target circuit 100 and the replica circuit 10. By adjusting a power supply voltage or the bias Vbp, the drain voltages Vd1 and Vd2 and the bias voltages Vd3 and Vd4 are changed in conjunction with each other, so that the operation point of the n-MOS transistor 101b can be arbitrarily shifted.

Moreover, the adjustment circuit 50 may be a variable power supply which is capable of adjusting a substrate voltage to be applied to the n-MOS transistors 101a through 101d. Although there are cases where a threshold voltage of each of the n-MOS transistors 101a through 101d are shifted to a higher level and an operation region is shifted to a linear region, respective threshold voltages of the n-MOS transistors 101a through 101d are changed by adjusting a substrate voltage, so that a pinch-off point can be arbitrarily shifted. Accordingly, the operation point of the n-MOS transistor 101b can be made closer to the pinch-off point without specifically changing a drain current. The following equation holds for the relationship between the substrate voltage Vbs and the threshold voltage Vt.

$$Vt = Vt0 + \gamma(\sqrt{(Vbs + 2\phi F)} - \sqrt{(2\phi F)})$$

where Vt0 is a threshold voltage when a voltage between a substrate and a source is 0, γ is a coefficient expressing effects of a substrate bias, and øF is a Fermi potential. In this manner, a threshold voltage has influences as a square root function of a substrate voltage.

When a power supply voltage is adjusted, an entire CMOS circuit is influenced. In contrast to this case, when a substrate voltage is adjusted, the adjustment locally influences, for example, only a p-substrate. Therefore, in consideration of influences on other components, it is more advantageous to adjust a substrate voltage. A substrate voltage has a setting limit. For example, in terms of reliability of an n-MOS transistor, there is an upper limit value for a substrate voltage of a p-substrate. When a substrate voltage exceeds the setting limit, each of a p-n junction between a substrate and a source and a p-n junction between the substrate and a drain becomes a forward p-n junction. Accordingly, a current flows into the substrate and the MOS transistor does not function as a transistor. Using this characteristic, even with a substrate voltage set to be a setting limit value, it can be judged that the CMOS circuit is a defect which can not be compensated within a rated voltage range, if a difference between the drain currents Id1 and Id2 is generated.

Figure 3:
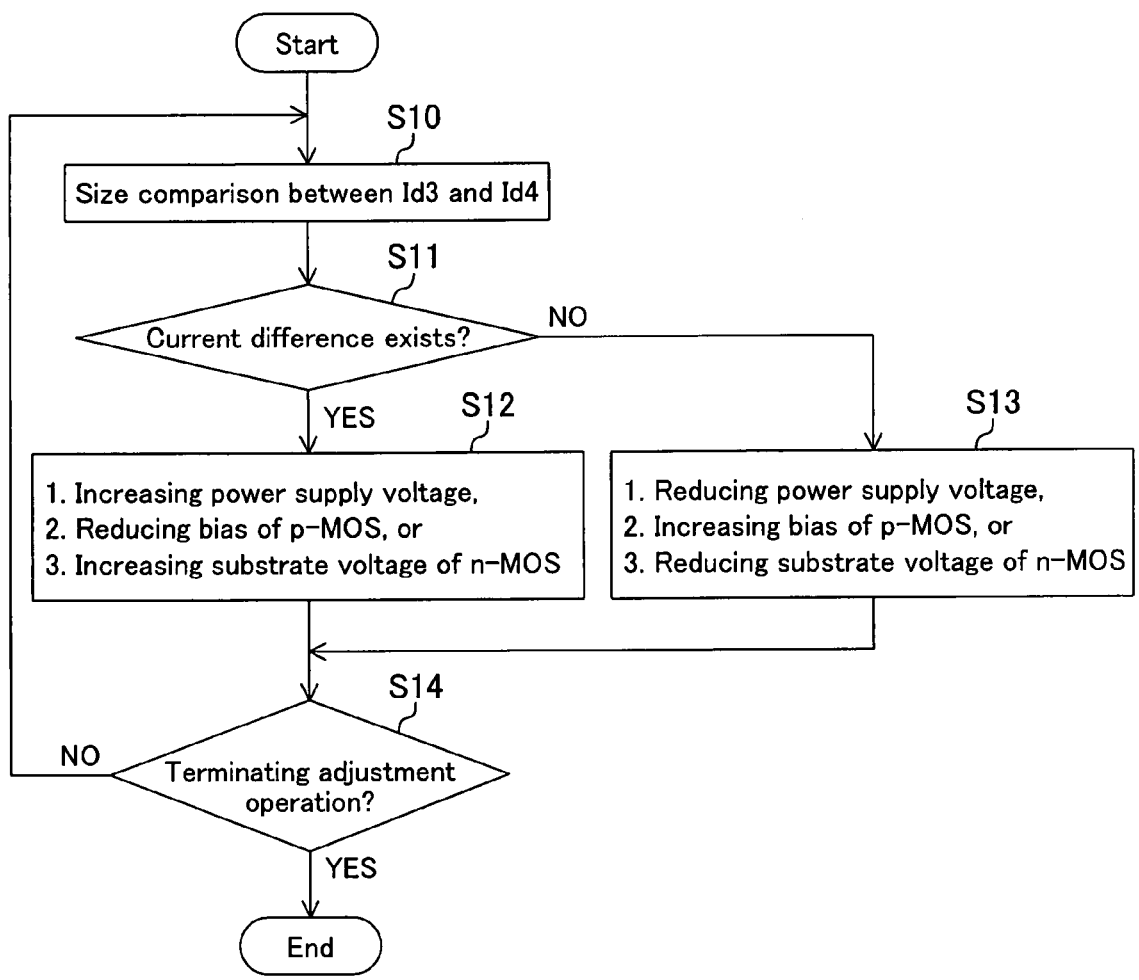
FIG. 3 is a flowchart of characteristic adjustment.

An operation sequence of the CMOS circuit characteristic automatic adjustment apparatus of this embodiment will be described with reference to a flowchart of FIG. 3. First, respective sizes of the drain current Id3 of the n-MOS transistor 101c and the drain current Id4 of the n-MOS transistor 101d are compared (Step S10). Then, when a current difference between the drain currents Id3 and Id4 exists (YES in Step S11), any one of the operations of (1) increasing a power supply voltage of each of the target circuit 100 and the replica circuit 10, (2) reducing the bias Vbp and (3) increasing respective substrate voltages of the n-MOS transistors 101a through 101d is performed (Step S12). On the other hand, when a current difference between the drain currents Id3 and Id4 does not exist (NO in Step S11), an opposite operation to Step S12, i.e., any one of the operations of (1) reducing a power supply voltage of each of the target circuit 100 and the replica circuit 10, (2) increasing the bias Vbp and (3) reducing respective substrate voltages of the n-MOS transistors 101a through 101d is performed (Step S13). Following Step S12 or Step S13, whether or not an adjustment operation is to be terminated is judged. Then, if it is judged that the adjustment operation is to be continued (NO in Step S14), the process returns to Step S10. By this operation sequence, the operation range of the n-MOS transistor 101a can be made close to an optimal operation range (see FIG. 2).

The above-described operation sequence can be executed at circuit initialization at a start of an operation of a CMOS circuit and the like, or at regular intervals (for example, per 1 ms) within a range in which a circuit operation is not influenced by this operation sequence. By executing the above-described operation sequence at circuit initialization, an operation point shift which is sample dependent, i.e., dependent on process variations can be dealt with. Moreover, by executing the above-described sequence at regular intervals, an operation point shift which is dependent on an operation state caused by temperature change and the like can be dealt with.

The adjustments of various voltages in Step S12 and Step S13 may be continuously performed and also may be discretely performed. That is, when an analog signal having a corresponding size to a current difference between the drain currents Id3 and Id4 is output, the voltages may be continuously adjusted according to the analog signal. When a digital signal indicating whether or not a current difference between the drain currents Id3 and Id4 exists is output, the various voltages may be discretely adjusted. For example, the voltages may be adjusted in a stepwise manner so that each voltage is changed by a predetermined level, e.g., 100 mV, at a time.

Furthermore, it is preferable that an adjustment width in Step S12 is set to be larger than an adjustment width in Step S13. For example, in Step S12, adjustment may be performed so that each voltage is changed by 100 mV at a time, and in Step S13, adjustment may be performed so that each voltage is changed at a time by 10 mV, which is 1/10 of 100 mV used in Step S12. The following is the reason for the above-described setting. When the n-MOS transistor 101a is not operated in a saturated region, the n-MOS transistor 101a has to be operated in a saturated region as soon as possible. However, if rapid adjustment is performed while the n-MOS transistor 101a is operated in a saturated region, the operation range of the n-MOS transistor 101a might go out of the saturated region.

Moreover, Step S13 may be omitted. Even if only Step S12 is performed, the intended purpose of making the n-MOS transistor 101a operated in a saturated region can be achieved. In Step S12, if each of various voltages is set to be a limit of its adjustment range by single adjustment, the operation region of the n-MOS transistor 101a can be shifted to within a saturated region in a shortest time.

As has been described, according to this embodiment, particularly without increasing a circuit size and power consumption, a CMOS circuit characteristics can be automatically adjusted so that an MOS transistor as a constant current supply in a target circuit is operated in a saturated region.

Second Embodiment

Figure 4:
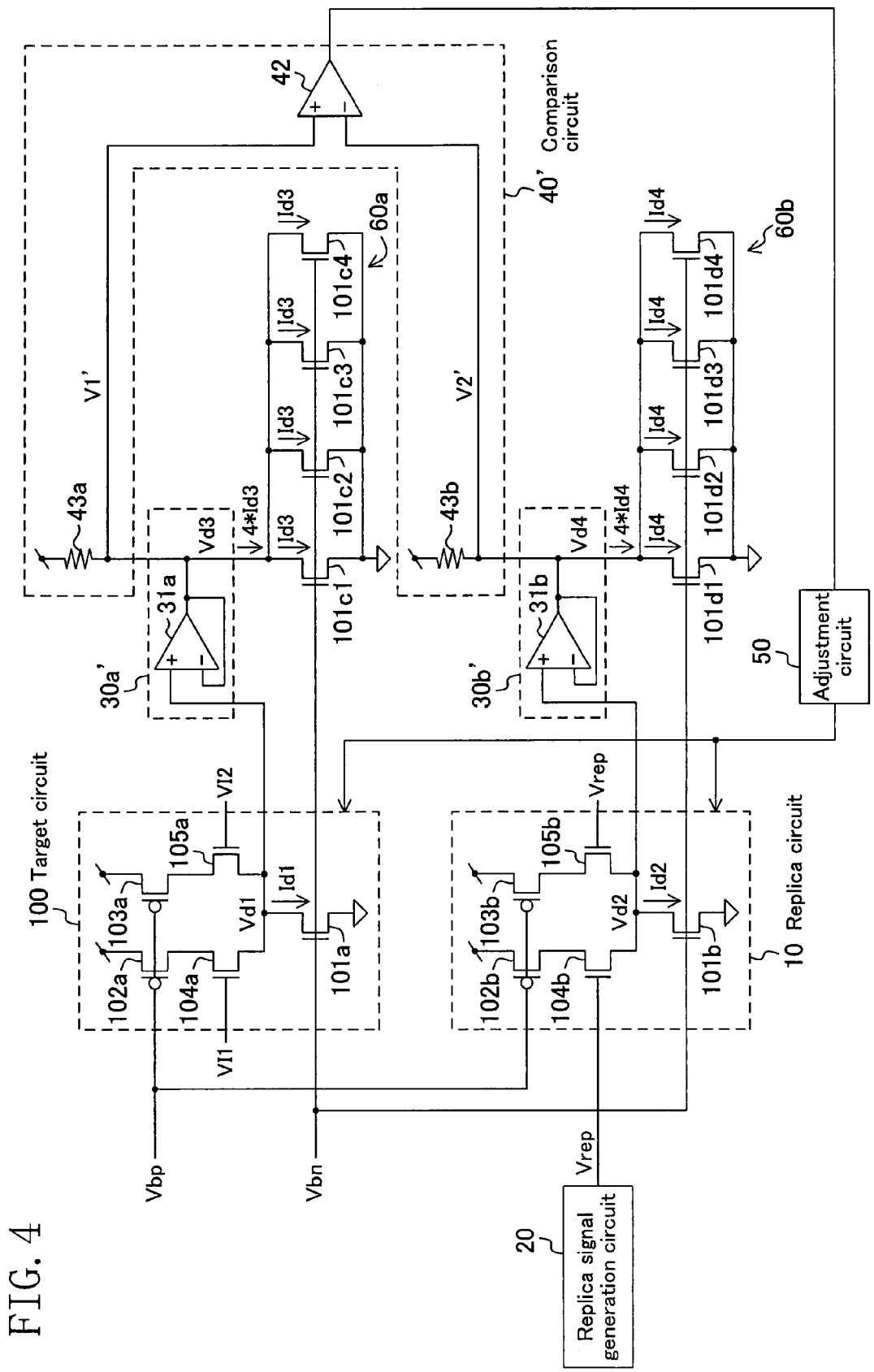
FIG. 4 is a circuit diagram illustrating a configuration of a CMOS circuit characteristic automatic adjustment apparatus according to a second embodiment of the present invention.

FIG. 4 is a circuit diagram illustrating a configuration of a CMOS circuit characteristic automatic adjustment apparatus according to a second embodiment of the present invention. The apparatus of this embodiment includes a replica circuit 10, a replica signal generation circuit 20, voltage buffers 30a' and 30b', a comparison circuit 40', an adjustment circuit 50 and MOS transistor groups 60a and 60b. The apparatus adjusts an operation state of a target circuit 100 so that an n-MOS transistor 101a as a constant current power supply in the target circuit 100 is operated in a saturated region. The replica circuit 10, the replica signal generation circuit 20 and the adjustment circuit 50 are the same as those of the apparatus of the first embodiment. Therefore, the description of these circuits will be omitted and, hereafter, only different points from the first embodiment will be described.

The MOS transistor group 60a includes four n-MOS transistors 101c1, 101c2, 101c3 and 101c4. The MOS transistor group 60b includes four n-MOS transistors 101d1, 101d2, 101d3 and 101d4. Each of the n-MOS transistors 101c1 through 101c4 and the n-MOS transistors 101d1 through 101d4 has the same characteristics as those of the n-MOS transistor 101a in the target circuit 100. In each of the n-MOS transistors 101c1 through 101c4 and the n-MOS transistors 101d1 through 101d4, a bias Vbn is applied to a gate and a reference voltage is applied to a source. The number of n-MOS transistors constituting each of the MOS transistor groups 60a and 60b is arbitrary. For convenience in description, the number of n-MOS transistors is 4 in this embodiment.

The voltage buffer 30a' is a voltage follower circuit including an operational amplifier 31a. The operational amplifier 31a receives a drain voltage Vd1 of the n-MOS transistor 101a in the target circuit 100. Although accuracy is a little reduced, compared to the voltage buffer 30a of FIG. 1 including the n-MOS transistor 32a because an output terminal of the operational amplifier 31a is directly connected to the MOS transistor group 60a, the voltage buffer 30a' can equalize a drain voltage Vd3 at each of the n-MOS transistors 101c1 through 101c4 in the MOS transistor group 60a to the drain voltage Vd1.

The voltage buffer 30b' is a voltage follower circuit including an operational amplifier 31b. The operational amplifier 31b receives a drain voltage Vd2 of the n-MOS transistor 101b in the replica circuit 10. Although, accuracy is reduced a little, compared to the voltage buffer 30b of FIG. 1 including the n-MOS transistor 32b because an output terminal of the operational amplifier 31b is directly connected to the MOS transistor group 60b, the voltage buffer 30b' can equalize a drain voltage Vd4 at each of the n-MOS transistors 101d1 through 101d4 in the MOS transistor group 60b to the drain voltage Vd2.

In each of the n-MOS transistors 101c1 through 101c4, a drain current Id1 flowing through the n-MOS transistor 101a is mirrored and a drain current Id3 flows. In the MOS transistor group 60a, a current (4*Id3) which is four times as large as the drain current Id3 flows. In the same manner, in each of the n-MOS transistors 101d1 through 101d4, a current Id2 flowing through the n-MOS transistor 101b is mirrored and a drain current Id4 flows. In the MOS transistor group 60b, a current (4*Id4) which is four times as large as the drain current Id4 flows. Accordingly, in each of the MOS transistor groups 60a and 60b, a current corresponding to a four-fold current of an associated one of the drain currents Id1 and Id2 flows.

The comparison circuit 40' includes a comparator 42 and resistors 43a and 43b. The resistor 43a is operated as an active load or an I-V conversion circuit for converting a current (4*Id3) flowing through the MOS transistor 60a to a voltage V1'. In the same manner, the resistor 43b is operated as an active load or an I-V conversion circuit for converting a current (4*Id4) flowing through the MOS transistor group 60b to a voltage V2'. The comparator 42 compares respective sizes of the voltages V1' and V2' converted by the resistors 43a and 43b, respectively. That is, the comparison circuit 40' substantially compares respective sizes of a current corresponding to a four-fold of the drain current Id1 and a current corresponding to a four-fold of the drain current Id2.

As has been described, according to this embodiment, a current difference between a drain current of an MOS transistor as a constant current supply in a target circuit and a drain current of a corresponding MOS transistor in a replica circuit can be detected with four-fold accuracy, compared to the first embodiment. Therefore, even when respective currents flowing in the target circuit and the replica circuit are small, a current difference between the currents can be detected.

The above-described configuration has been devised to ensure saturated region operability of an n-MOS transistor in a target circuit. However, the present invention can be used to ensure saturated region operability of a p-MOS transistor in a target circuit. Needless to say, in that case, for example, adjustments in Step S12 and Step S13 in FIG. 2 are reversed.

Moreover, if it is desired to merely detect the saturated region operability of each MOS transistor in a target circuit, the adjustment circuit 50 can be omitted in each of the first and second embodiments. Thus, an inventive apparatus can be function as an MOS transistor characteristic detection apparatus.

What is claimed is:

1. An MOS transistor characteristic detection apparatus for detecting whether or not a first MOS transistor in a target circuit is operated in a saturated region, the apparatus comprising:
   a replica signal generation circuit for generating a replica signal capable of minimizing, if being received by the target circuit, a drain voltage of the first MOS transistor;
   a replica circuit for receiving the replica signal, the replica circuit being a replica of the target circuit and including a second MOS transistor corresponding to the first MOS transistor;
   a first voltage buffer for receiving a drain voltage of the first MOS transistor;
   a second voltage buffer for receiving a drain voltage of the second MOS transistor;
   a first MOS transistor group including at least one MOS transistor which has the same characteristics as those of the first MOS transistor and in which the same voltages as voltages applied to a gate and a source of the first MOS transistor are applied to a gate and a source, respectively, and an output voltage of the first voltage buffer is applied to a drain;
   a second MOS transistor group including at least one MOS transistor which has the same characteristics as those of the first MOS transistor and in which the same voltages as voltages applied to a gate and a source of the first MOS transistor are applied to a gate and a source, respectively, and an output voltage of the second voltage buffer is applied to a drain; and
   a comparison circuit for comparing respective sizes of a first current flowing through the first MOS transistor group and a second current flowing through the second MOS transistor group.

2. The apparatus of claim 1, wherein the comparison circuit includes a first I-V conversion circuit for converting the first current to a first voltage, a second I-V conversion circuit for converting the second current to a second voltage, and a comparator for comparing respective sizes of the first and second voltages.

3. The apparatus of claim 2, wherein each of the first and second I-V conversion circuits includes a diode-connected MOS transistor.

4. The apparatus of claim 2, wherein each of the first and second I-V conversion circuits includes a resistor.

5. The apparatus of claim 1, wherein the first voltage buffer includes an operational amplifier for receiving the drain voltage of the first MOS transistor and a drain voltage of said at least one MOS transistor of the first MOS transistor group, and an MOS transistor connected to the first MOS transistor group and having a gate to which an output voltage of the operational amplifier is applied, and
   wherein the second voltage buffer includes an operational amplifier for receiving the drain voltage of the second MOS transistor and a drain voltage of said at least one MOS transistor of the second MOS transistor group, and an MOS transistor connected to the second MOS transistor group and having a gate to which an output voltage of the operational amplifier is applied.

6. A CMOS circuit characteristic automatic adjustment apparatus for automatically adjusting an operation state of the CMOS circuit so that a first MOS transistor in a target circuit in the CMOS circuit is operated in a saturated region, the apparatus comprising:
   a replica signal generation circuit for generating a replica signal capable of minimizing, if being received by the target circuit, a drain voltage of the first MOS transistor;
   a replica circuit for receiving the replica signal, the replica circuit being a replica of the target circuit and including a second MOS transistor corresponding to the first MOS transistor;
   a first voltage buffer for receiving a drain voltage of the first MOS transistor;
   a second voltage buffer for receiving a drain voltage of the second MOS transistor;
   a first MOS transistor group including at least one MOS transistor which has the same characteristics as those of the first MOS transistor and in which the same voltages as voltages applied to a gate and a source of the first MOS transistor are applied to a gate and a source, respectively, and an output voltage of the first voltage buffer is applied to a drain;
   a second MOS transistor group including at least one MOS transistor which has the same characteristics as those of the first MOS transistor and in which the same voltages as voltages applied to a gate and a source of the first MOS transistor are applied to a gate and a source, respectively, and an output voltage of the second voltage buffer is applied to a drain;
   a comparison circuit for comparing respective sizes of a first current flowing through the first MOS transistor group and a second current flowing through the second MOS transistor group; and
   an adjustment circuit for adjusting, based on a comparison result by the comparator circuit, an operation state of each of the target circuit and the replica circuit.

7. The apparatus of claim 6, wherein the comparison circuit outputs, as the comparison result, a digital signal indicating whether or not a current difference between the first and second currents exists, and
   wherein when the digital signal indicates that the current difference exists, the adjustment circuit adjusts respective operation states of the target circuit and the replica circuit so that the second current becomes closer to the first current.

8. The apparatus of claim 7, wherein the adjustment circuit sets respective operation states of the target circuit and the replica circuit by a single adjustment so that each of the operation state becomes a limit of a possible adjustment range.

9. The apparatus of claim 7, wherein when the digital signal indicates that the current difference does not exist, the adjustment circuit adjusts respective operation states of the target circuit and the replica circuit so that an operation point of the second MOS transistor becomes closer to a pinch-off point.

10. The apparatus of claim 9, wherein an adjustment width when the second current is made closer to the first current is larger than an adjustment width when an operation point of the second transistor is made closer to the pinch-off point.

11. The apparatus of claim 6, wherein the comparison circuit outputs, as the comparison result, an analog signal having a corresponding size of the current difference between the first and second currents, and
   wherein the adjustment circuit adjusts respective operation states of the target circuit and the replica circuit according to the analog signal so that an operation point of the second MOS transistor becomes closer to a pinch-off point.

12. The apparatus of claim 6, wherein the adjustment circuit adjusts a power supply voltage to be applied to the target circuit and the replica circuit.

13. The apparatus of claim 6, wherein the adjustment circuit adjusts a bias to be applied to the target circuit and the replica circuit.

14. The apparatus of claim 6, wherein the adjustment circuit adjusts a substrate voltage to be applied to the first and second MOS transistors and the MOS transistors in the first and second MOS transistor groups.

* * * * *